United States Patent [19]

Neidorff

[11] Patent Number: 4,517,532

[45] Date of Patent: May 14, 1985

[54] PROGRAMMABLE RING OSCILLATOR

[75] Inventor: Robert A. Neidorff, Chandler, Ariz.

[73] Assignee: Motorola, Inc., Schaumburg, Ill.

[21] Appl. No.: 510,049

[22] Filed: Jul. 1, 1983

[51] Int. Cl.³ ............................................. H03K 3/03
[52] U.S. Cl. .................................. 331/57; 331/108 C;
331/179; 331/DIG. 3
[58] Field of Search ................. 331/57, 108 C, 108 D,
331/DIG. 3, 177 R, 179

[56] References Cited

U.S. PATENT DOCUMENTS 4,079,338  3/1978  Kronlage ........................ 331/177 R
4,105,950  8/1978  Dingwall .............................. 331/57
4,388,536  6/1983  Peil et al. ............................ 307/268
4,392,105  7/1983  McLeod ........................... 331/57 X Primary Examiner—Siegfried H. Grimm
Attorney, Agent, or Firm—Vincent B. Ingrassia

[57] ABSTRACT

This relates to a programmable ring oscillator which comprises a plurality of series coupled gates the output of the last of which is fed back to the input of the first. Bypass means are coupled across the outputs of selected gates so as to in effect increase or decrease the length of the string. In one embodiment, laser trimmable fuses are employed in the bypass networks. In a second embodiment, a data selector under external control is employed.

8 Claims, 4 Drawing Figures

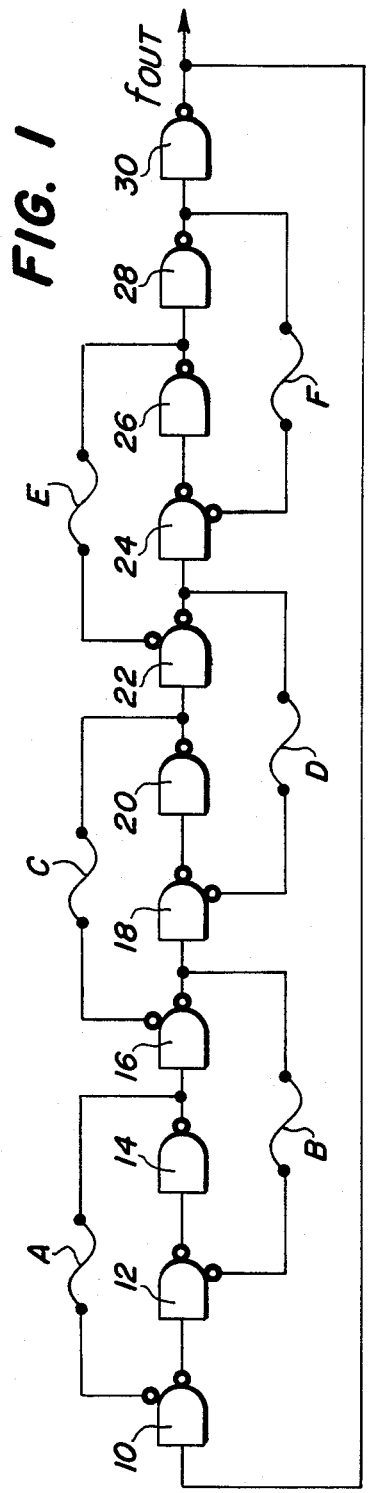
FIG. 1
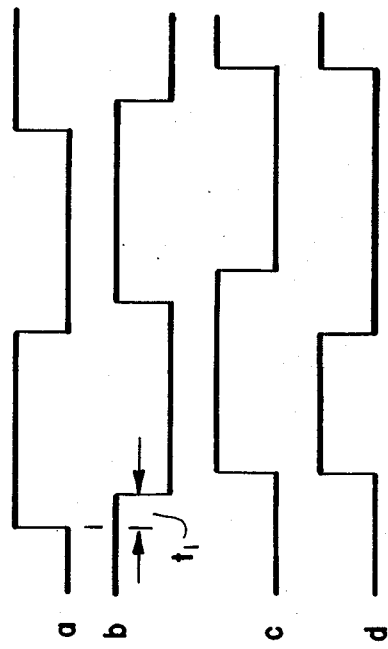
FIG. 3
FIG. 2

PROGRAMMABLE RING OSCILLATOR

BACKGROUND OF THE INVENTION

This invention relates generally to oscillators and, more particularly, to an integrated ring oscillator circuit having an adjustable frequency.

There are many instances in which the frequency of an oscillator must be varied or adjusted, and there are known techniques for accomplishing this. For example, it is known to laser trim a resistor to achieve a desired oscillator frequency. Unfortunately, this process is time consuming and suffers from poor temperature performance due to the on-chip diffused resistor. The situation is complicated by the difficulties associated with accurately measuring low frequencies.

It is also known to employ analog switches for the purpose of altering capacitor and/or resistor values which will in turn alter the oscillator frequency. This analog approach suffers from the additional disadvantage of being complex and requiring additional chip area to accommodate the control circuitry.

SUMMARY OF THE INVENTION

It is an object of the present invention to provide an improved programmable oscillator.

It is a further object of the present invention to provide an improved programmable oscillator implemented using low cost logic family components.

It is yet another object of the present invention to provide an improved programmable oscillator which is digital in nature and is therefore highly accurate.

According to a broad aspect of the invention, there is provided a programmable ring oscillator comprising a plurality of series coupled gates; and at least one bypass means coupled between the outputs of first and second selected ones of said plurality to alter the frequency of said oscillator.

The above and other objects, features, and advantages of the present invention will be more clearly understood from the following detailed description taken in conjunction with the accompanying drawings, in which:

BRIEF DESCRIPTION OF THE DRAWINGS

FIG. 1 is a schematic diagram of a first embodiment of the inventive ring oscillator;

FIG. 2 is a schematic diagram of an I²L gate having first and second open collector outputs and of the type used to implement the circuit shown in FIG. 1;

FIG. 3 is a timing diagram which is useful in explaining how the circuit of FIG. 1 operates.

DESCRIPTION OF THE PREFERRED EMBODIMENT

Figure 4:
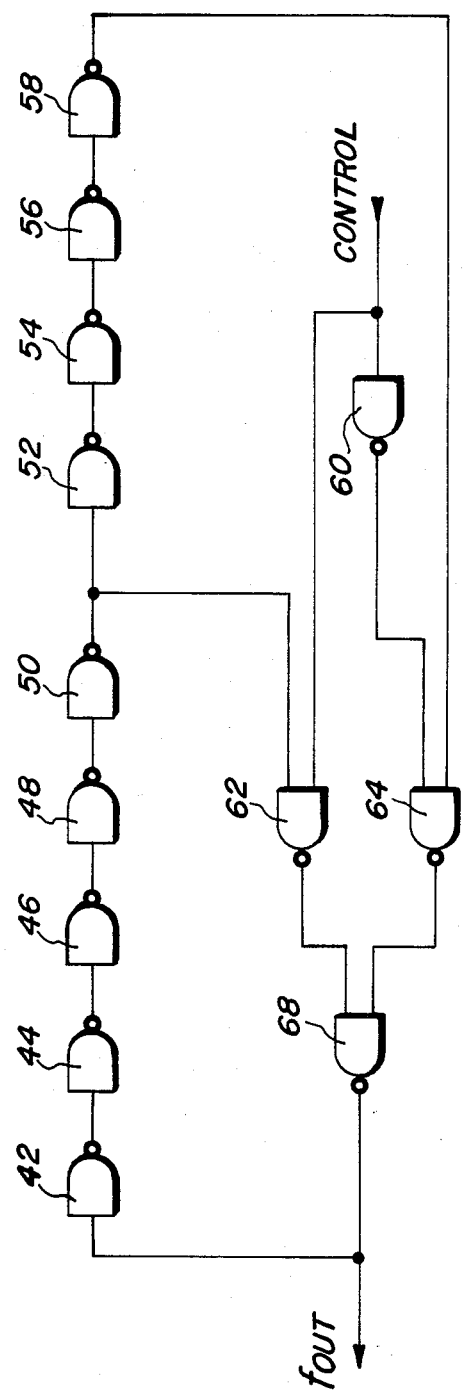
FIG. 4 is a schematic diagram of a second embodiment of the inventive oscillator.

Referring to FIG. 1, the inventive ring oscillator comprises a plurality of series coupled gates 10, 12, 14, 16, 18, 20, 22, 24, 26, 28 and 30. It should be noted that there are an odd number of gates and therefore the output signal appearing at the output of gate 30 will be inverted with respect to the signal applied to the input of gate 10 from which the output signal is derived. Therefore, since the output signal $f_{OUT}$ is fed back to the input of gate 10, two propagations through the series connected chain of gates is required to produce a full period of the output signal. Each of the gates shown on FIG. 1 is preferably an integrated injection logic gate (I²L) although RTL logic may be used if multiple output wired ORs are employed.

Referring to FIG. 2, each I²L gate comprises a PNP transistor 32 having a base coupled to ground and an emitter coupled to a common current bus 34. Current is supplied to the bus from a positive source of supply V+ by means of current source 36. The collector of transistor 32 is coupled to receive an input signal (IN) as is the base of NPN transistors 38 and 40. The emitters of transistors 38 and 40 are coupled to ground while the collectors of 38 and 40 are coupled to output terminals $C_1$ and $C_2$ respectively. This inverting I²L gate operates as follows. If an open circuit exists at the input (IN), transistor 32 will supply base drive to transistors 38 and 40 turning them on. Thus, outputs $C_1$ and $C_2$ will go low. If the input voltage (IN) should go low, current is diverted away from the base electrodes of transistors 38 and 40 maintaining them in an off condition and causing the voltages at $C_1$ and $C_2$ to remain high.

Each gate shown in FIG. 1 represents an inverter gate of the type shown in FIG. 2 wherein each of the small circles associated with each gate represents an open collector output terminal.

As can be seen, a plurality of laser trimmable fuses are coupled across selected outputs in the chain. For example, fuse A is coupled between the outputs of gates 10 and 14. Fuse B is coupled between the outputs of gates 12 and 16. Similarly, fuse C is coupled between the outputs of gates 16 and 20, fuse D across the outputs of gates 18 and 22, fuse E across the outputs of gates 22 and 26, and fuse F across the outputs of gates 24 and 28.

Assuming that all of the fuses are opened, the output frequency of the oscillator ($f_{OUT}$) will equal the reciprocal of the propagation delay through 22 gates (i.e. twice through the chain). Leaving in any one of the fuses (e.g. fuse A) shortens the output period by two propagation delays. It may be thought that such action would improve the speed by four propagation delays since each period corresponds to two propagations through the chain. This is not the case however since a high output at gate 10 will have no impact on the output of gate 14 whereas a low output at gate 10 will force the output of gate 14 low regardless of the signal appearing at its input. For example, reference is made to the waveforms shown in FIG. 3. The top line (a) of FIG. 3 illustrates a signal which appears at the input of gate 10. After a short propagation delay corresponding to time $t_1$, the output of gate 12 will go low as is shown in line (b) of FIG. 3. If fuse A were trimmed (blown) such that there were no connection between the output of gate 10 and the output of gate 14, the signal appearing at the output of gate 14 would correspond to that shown in the third line (c) of FIG. 3. That is, the signal appearing at the output of gate 14 would be an inverted and slightly delayed version of the signal appearing at the output of gate 12. With fuse A intact, however, the output of gate 14 will be pulled low when the output of gate 10 goes low as is shown in the fourth line (d) of FIG. 3.

Each fuse trimmed will lengthen this period by two gate delays. Thus, the period of the output signal may vary from a maximum of twenty-two gate delays if all of the fuses are trimmed and a minimum of ten gate delays if none fuses are trimmed. Selected fuses may be trimmed to achieve periods between the minimum and maximum.

The fuses shown in FIG. 1 may be metal (e.g. aluminum), thin film resistor material (e.g. silicon chromium, nickel chromium), or thick film resistor material.

FIG. 4 illustrates an alternate embodiment of the present invention wherein the output frequency of the oscillator is altered through the use of a data selector switch and a control signal. As can be seen, the circuit of FIG. 4 includes a chain of series connected inverter gates 42, 44, 46, 48, 50, 52, 54, 56 and 58 of the type previously described. The circuit also includes a data selector switch which includes an inverter gate 60 and two-input NAND gates 62, 64 and 68. A control signal capable of assuming at least first and second states is coupled to the input of inverter gate 60 and to a first input of NAND gate 62. The output of inverter gate 60 is coupled to a first input of NAND gate 64. The outputs of NAND gates 62 and 64 are coupled respectively to first and second inputs of NAND gate 68. The oscillator output signal is taken from the output of NAND gate 68 which is also fed back to the input of gate 42. The second input of NAND gate 62 is coupled to the output of gate 50, and the second input of NAND gate 64 is coupled to the output of gate 58. Thus, if the CONTROL signal is high, NAND gate 62 will be enabled so as to pass the signal appearing at the output of gate 50 through NAND gates 62 and 68. NAND gate 64 will be disabled since the output of gate 60 will be low. In this case, only gates 42, 44, 46, 48 and 50 are in the string thus increasing the frequency of the output signal ($f_{OUT}$). Alternatively, if the CONTROL signal goes low, NAND gate 62 will be disabled and NAND gate 64 enabled such that the output of gate 58 is passed through NAND gates 64 and 68. In this case, the series string has been expanded to include gates 52, 54, 56 and 58 thus increasing the period of the output signal and reducing its frequency.

The above description is given by way of example only. Changes in form and detail may be made by one skilled in the art without departing from the scope of the invention. For example, the number of gates bypassed by the fuses of FIG. 1 or the data select circuitry of FIG. 4 may be varied. The gates may be bypassed in discrete steps or in binary weighted steps. The circuitry in FIG. 4 may be implemented using any of the well known logic families. Finally, any suitable fuses may be used such as metallic, thick film or thin film fuses.

I claim:
1. A programmable ring oscillator comprising:
   a plurality of series coupled inverter gates; and
   a plurality of bypass means coupled between the outputs of selected ones of said plurality of inverter gates to alter the frequency of said oscillator, each of said bypass means including a laser trimmable fuse.
2. A programmable ring oscillator according to claim 1 wherein each of said inverter gates is an integrated injection logic gate.
3. A programmable ring oscillator according to claim 1 wherein the output of the last of said plurality of inverter gates is fed back to the input of the first of said plurality of inverter gates.
4. A programmable ring oscillator according to claim 3 wherein said laser trimmable fuse is aluminum.
5. A programmable ring oscillator according to claim 3 wherein said laser trimmable fuse is silicon chromium.
6. A programmable ring oscillator according to claim 3 wherein said laser trimmable fuse is nickel chromium.
7. A programmable ring oscillator comprising: a plurality of series coupled gates; and at least one bypass means coupled between the outputs of first and second selected ones of said plurality to alter the frequency of said oscillator, wherein said bypass means is a data select switch having first and second data inputs, a control input, and a data output, said first and second data inputs being coupled to the outputs of first and second selected ones respectively of said plurality and said control input being coupled to a control signal which determines which of said first and second data inputs is coupled to said data output.
8. A programmable ring oscillator according to claim 7 wherein said first data input is coupled to the output of the last of said plurality and said data output is coupled to the input of the first of said plurality.

* * * * *